(12) United States Patent
Liu et al.

(10) Patent No.: US 10,685,896 B2
(45) Date of Patent: Jun. 16, 2020

(54) INTEGRATED CIRCUIT PACKAGE AND METHOD OF FABRICATING THE SAME

(71) Applicant: Taiwan Semiconductor Manufacturing Co., Ltd., Hsinchu (TW)

(72) Inventors: Zi-Jheng Liu, Taoyuan (TW); Hung-Jui Kuo, Hsinchu (TW); Yu-Hsiang Hu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 100 days.

(21) Appl. No.: 15/486,306

(22) Filed: Apr. 13, 2017

(65) Prior Publication Data
US 2018/0301389 A1    Oct. 18, 2018

(51) Int. Cl.
*H01L 23/31* (2006.01)
*H01L 23/498* (2006.01)
(Continued)

(52) U.S. Cl.
CPC .......... *H01L 23/3128* (2013.01); *H01L 21/56* (2013.01); *H01L 21/568* (2013.01); *H01L 21/6835* (2013.01); *H01L 23/49827* (2013.01); *H01L 23/49838* (2013.01); *H01L 23/544* (2013.01); *H01L 24/09* (2013.01); *H01L 24/14* (2013.01); *H01L 25/105* (2013.01); *H01L 25/117* (2013.01); *H01L 25/50* (2013.01); *H01L 23/49816* (2013.01); *H01L 23/5389* (2013.01); *H01L 2221/68359* (2013.01); *H01L 2223/5442* (2013.01); *H01L 2223/54426* (2013.01); *H01L 2224/0401* (2013.01); *H01L 2224/14181* (2013.01); *H01L 2224/214* (2013.01)

(58) Field of Classification Search
None
See application file for complete search history.

(56) References Cited

U.S. PATENT DOCUMENTS 9,000,584 B2    4/2015    Lin et al.
9,048,222 B2    6/2015    Hung et al.
(Continued)

*Primary Examiner* — Cory W Eskridge
(74) *Attorney, Agent, or Firm* — JCIPRNET

(57) ABSTRACT

An integrated circuit package including an integrated circuit component, a patterned dielectric liner, an insulating encapsulation, and a redistribution circuit structure is provided. The integrated circuit component includes an active surface and conductive vias distributed on the active surface. The patterned dielectric liner conformally covers the active surface of the integrated circuit component and sidewalls of the conductive vias. The insulating encapsulation encapsulates sidewalls of the integrated circuit component and covers the patterned dielectric liner. The insulating encapsulation includes a planar top surface. The planar top surface of the insulating encapsulation is substantially coplanar with top surfaces of the conductive vias. The insulating encapsulation and the conductive vias are spaced apart by the patterned dielectric liner. The redistribution circuit structure is disposed on the planar top surface of the insulating encapsulation, the top surfaces of the conductive vias and the patterned dielectric liner. The redistribution circuit structure is electrically connected to the conductive vias.

20 Claims, 13 Drawing Sheets

(51) Int. Cl.
*H01L 23/00* (2006.01)
*H01L 25/11* (2006.01)
*H01L 23/544* (2006.01)
*H01L 25/00* (2006.01)
*H01L 21/683* (2006.01)
*H01L 21/56* (2006.01)
*H01L 25/10* (2006.01)
H01L 23/538 (2006.01)

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2012/0028411 A1* | 2/2012 | Yu .................. H01L 21/561 438/107 |
| 2013/0168848 A1* | 7/2013 | Lin .................. H01L 24/19 257/737 |
| 2014/0252558 A1* | 9/2014 | Yu .................. H01L 23/544 257/618 |
| 2014/0252646 A1* | 9/2014 | Hung .............. H01L 23/481 257/774 |
| 2015/0348904 A1* | 12/2015 | Huang ............ H01L 21/76802 257/774 |

\* cited by examiner

INTEGRATED CIRCUIT PACKAGE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness and the reliability and fabrication costs of the integrated fan-out packages are highly concerned during IC packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
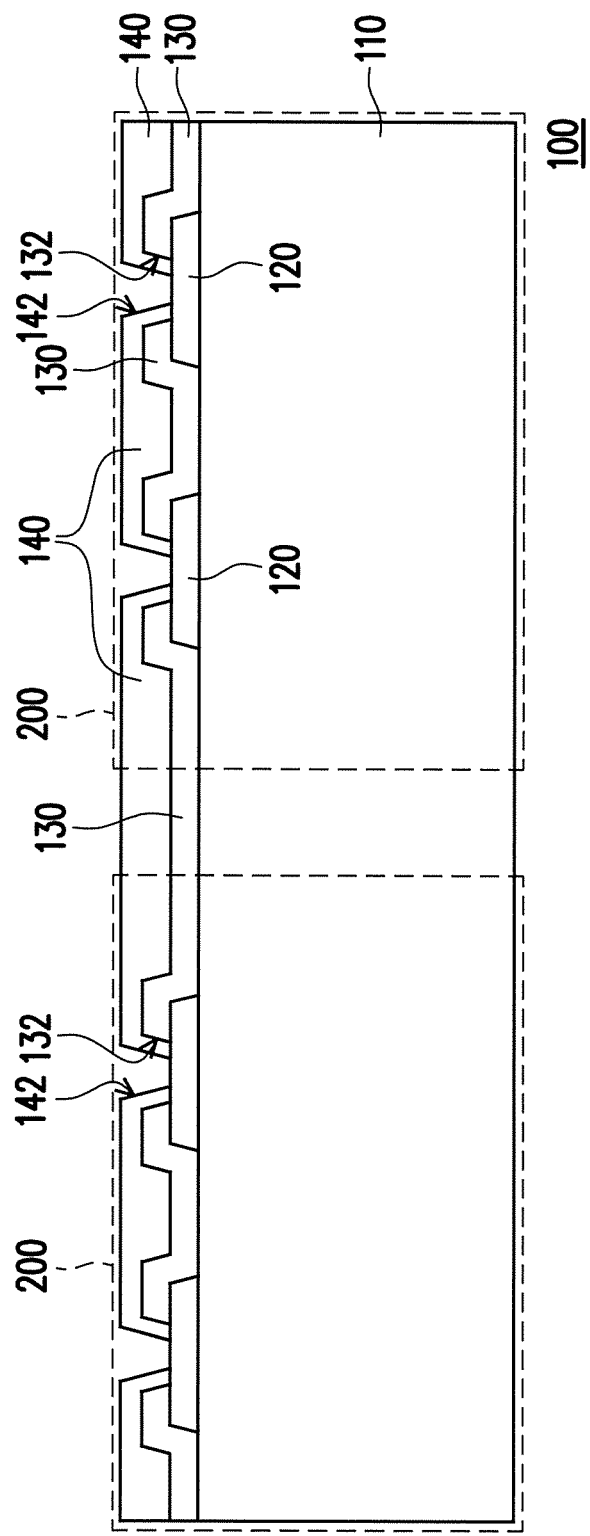
FIGS. 1 through 11 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 10:
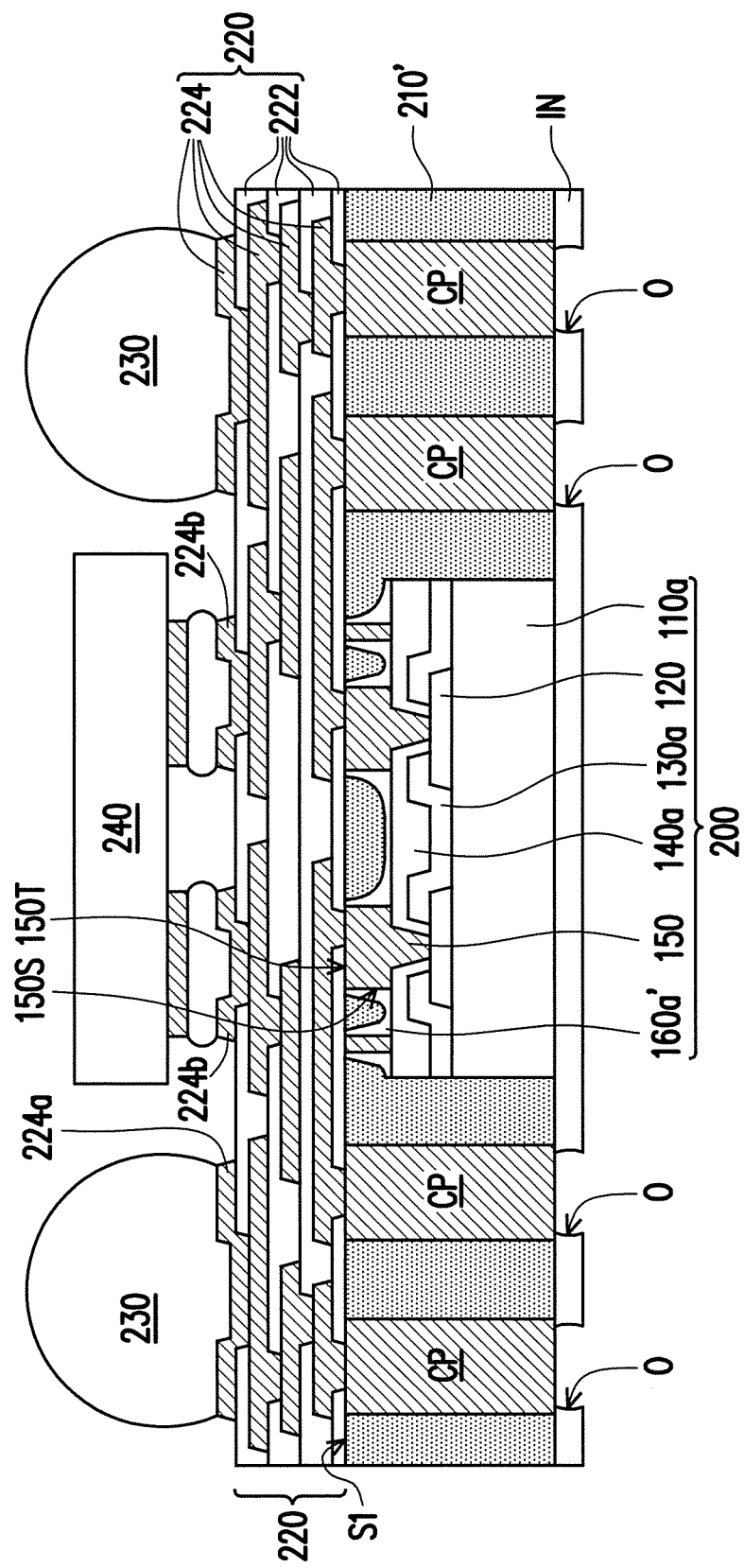
Figure 11:
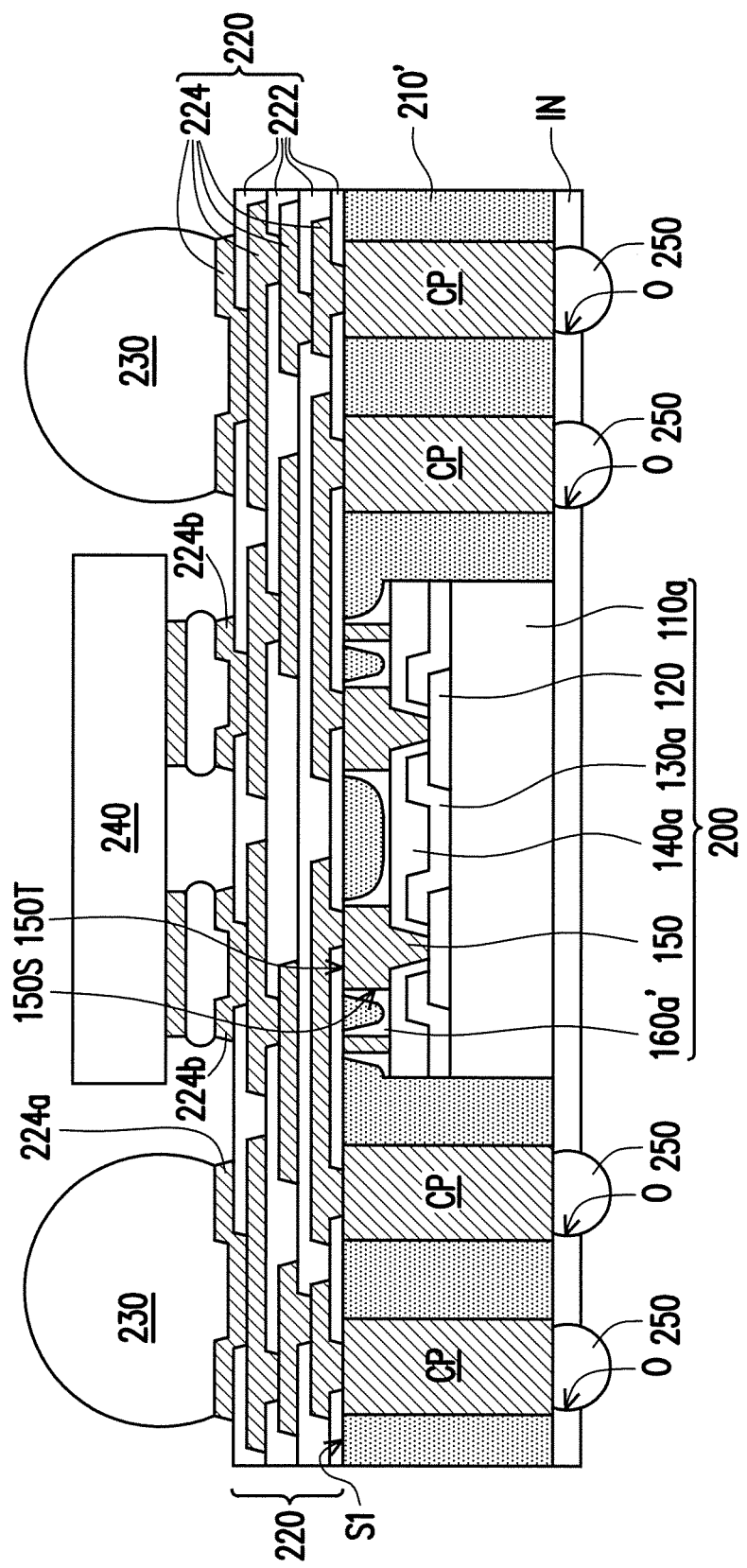
Figure 12:
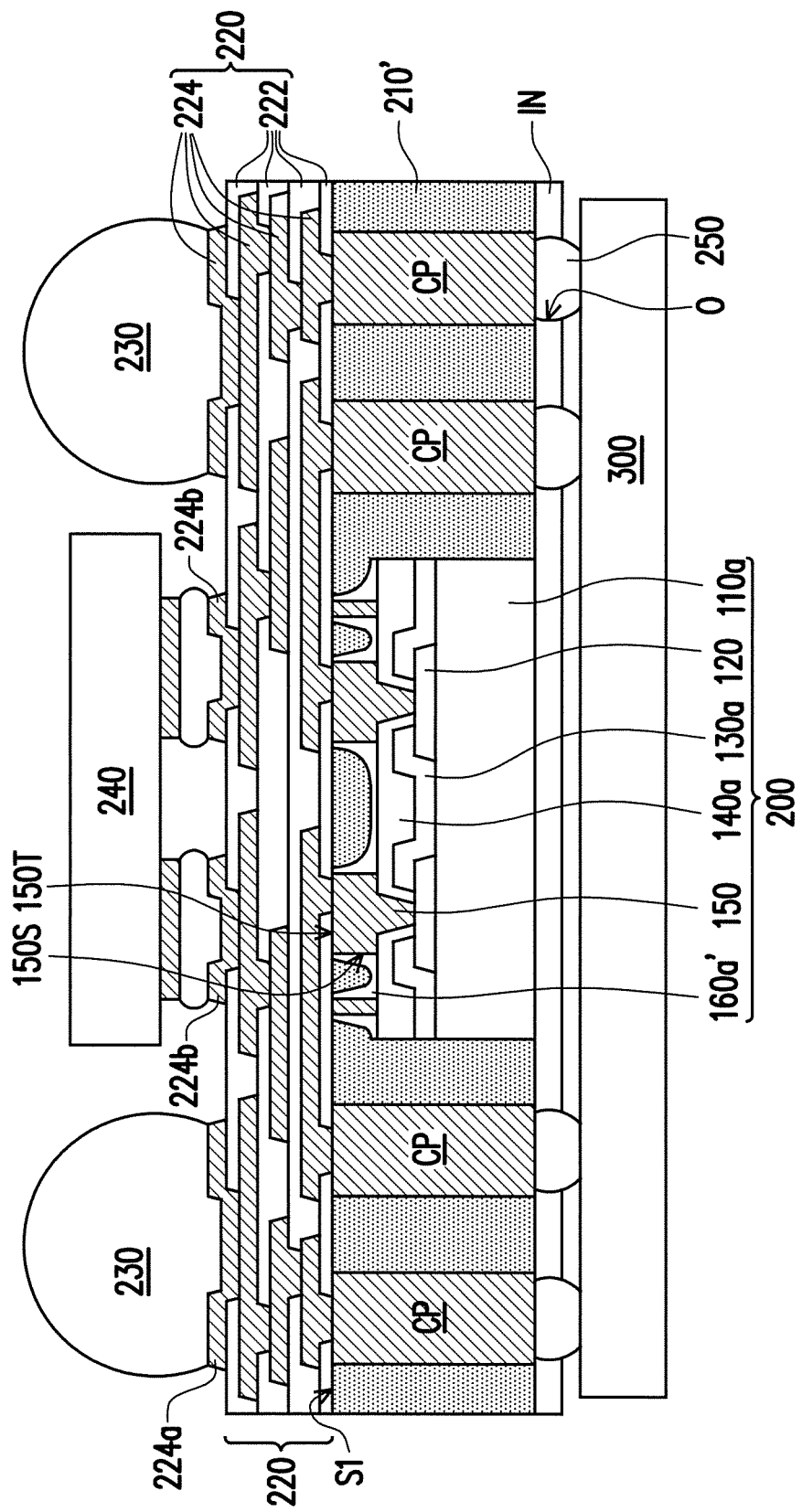
FIG. 12 is a cross-sectional view illustrating a package-on-package (POP) structure in accordance with some embodiments.
Figure 13:
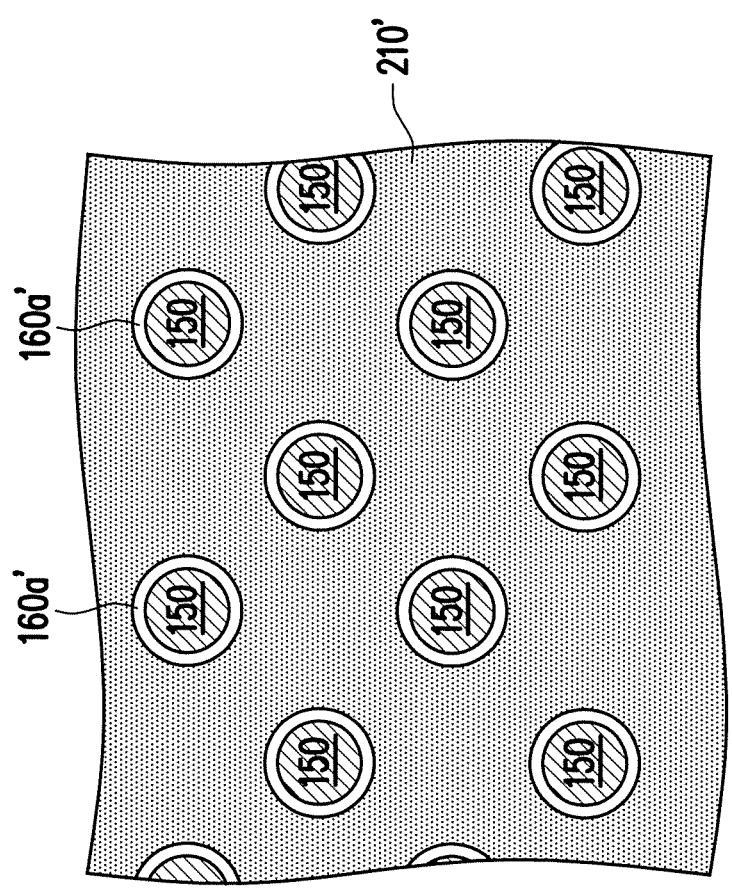
FIG. 13 is an enlarged top view illustrating the insulating encapsulation, the conductive vias and the patterned dielectric liner.

FIGS. 1 through 11 illustrate a process flow for fabricating an integrated fan-out package or an integrated circuit package in accordance with some embodiments, FIG. 12 is a cross-sectional view illustrating a package-on-package (POP) structure in accordance with some embodiments, and FIG. 13 is an enlarged top view illustrating the insulating encapsulation, the conductive vias and the patterned dielectric liner.

Referring to FIG. 1, a wafer 100 including a plurality of integrated circuit components 200 arranged in an array is provided. Before a wafer dicing process is performed on the wafer 100, the integrated circuit components 200 of the wafer 100 are connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110, has a plurality of contact opening 132, and partially covers the conductive pads 120. In other words, the conductive pads 120 distributed on the substrate 110 are partially exposed by the contact openings 132 of the passivation layer 130. For example, the semiconductor substrate 110 may be a silicon substrate including active components (e.g., transistors or the like) and/or passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxynitride layer or a dielectric layer formed by other suitable dielectric materials.

As shown in FIG. 1, in some embodiments, the wafer 100 may further include a post-passivation layer 140 formed over the passivation layer 130. The post-passivation layer 140 covers the passivation layer 130 and has a plurality of contact opening 142. Portions of the conductive pads 120 exposed by the contact opening 132 of the passivation layer 130 are partially covered by the post-passivation layer 140. In other words, the conductive pads 120 are partially exposed by the contact opening 142 of the post-passivation layer 140. For example, the post-passivation layer 140 may be a polyimide (PI) layer, a polybenzoxazole (PBO) layer, or a dielectric layer formed by other suitable polymers. It is noted that the formation of the post-passivation layer 140 is optional in some alternative embodiments.

Figure 2:
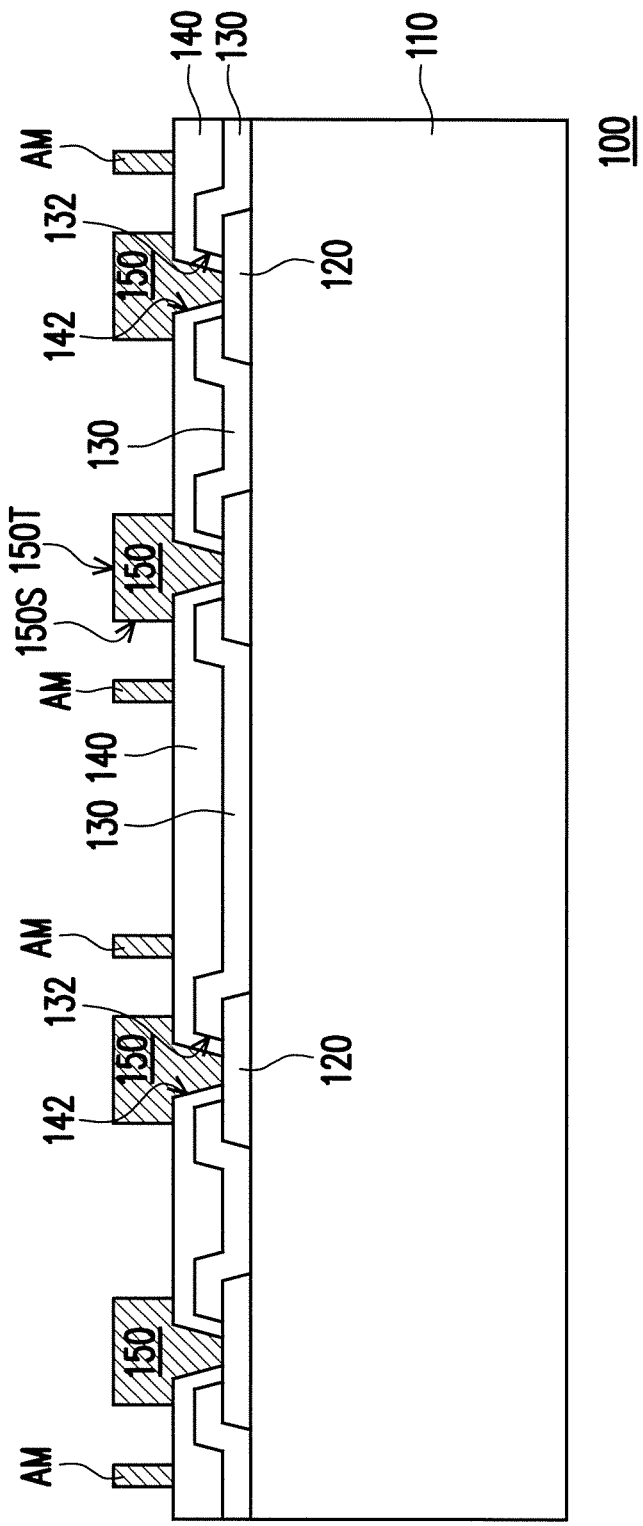

Referring to FIG. 2, a plurality of conductive vias 150 are formed on portions of the conductive pads 120 exposed by the contact opening 142 of the post-passivation layer 140. Each of the conductive vias 150 includes a top surface 150T and a sidewall 150S. The height of the conductive vias 150 may be greater than about 30 micrometers. In some alternative embodiments, the height of the conductive vias 150 ranges from about 5 micrometers to about 50 micrometers. In some embodiments, the conductive vias 150 are formed on the conductive pads 120 through plating. For example, a seed layer is sputtered onto the post-passivation layer 140 and the conductive pads 120 exposed by the contact opening 142 of the post-passivation layer 140; a patterned photoresist layer (not shown) for exposing the conductive pads 120 is then formed over the seed layer by photolithography; the wafer 100 including the patterned photoresist layer formed thereon is then immersed into a plating solution such that the conductive vias 150 are plated on the seed layer that is corresponding in position to the conductive pads 120. After the plated conductive vias 150 are formed, the patterned photoresist layer is removed. Thereafter, by using the conductive vias 150 as a hard mask, portions of the seed layer that are not covered by the conductive vias 150 are removed by etching, for example, until the post-passivation layer 140 is exposed. In some embodiments, the conductive vias 150 are copper vias or other metallic vias.

Referring to FIG. 2, during the fabricating of the conductive vias 150, one or more alignment marks AM may be formed on the top surface of the post-passivation layer 140. In some embodiments, the conductive vias 150 and the alignment marks AM are fabricated by the same process (e.g., a plating process). In such embodiments, the material of the conductive vias 150 is substantially the same with that of the alignment marks AM. In some embodiments, the alignment marks AM may be L-shaped alignment marks, cross-shaped alignment marks or alignment marks with other shapes. The shape and number of the alignment marks AM are not limited thereto according to the present disclosure. It is noted that the fabrication of the alignments AM is optional in some alternative embodiments, Referring to FIG. 3, after the conductive vias 150 and the alignment marks AM are formed on the wafer 100, a dielectric layer 160 is formed on the post-passivation layer 140 so as to conformally cover the top surfaces 150T and the sidewalls 150S of the conductive vias 150 and conformally cover top surfaces and sidewalls of the alignment marks AM. In other words, the dielectric layer 160 conforms to the contour of the conductive vias 150, the alignment marks AM and the post-passivation layer 140. In some embodiments, the dielectric layer 160 may be a polybenzoxazole (PBO) layer, a polyimide (PI) layer or other suitable polymer layer. In some alternative embodiments, the dielectric layer 160 may be made of inorganic materials. The dielectric layer 160 may be a void-free thin film having good film quality.

Figure 3:
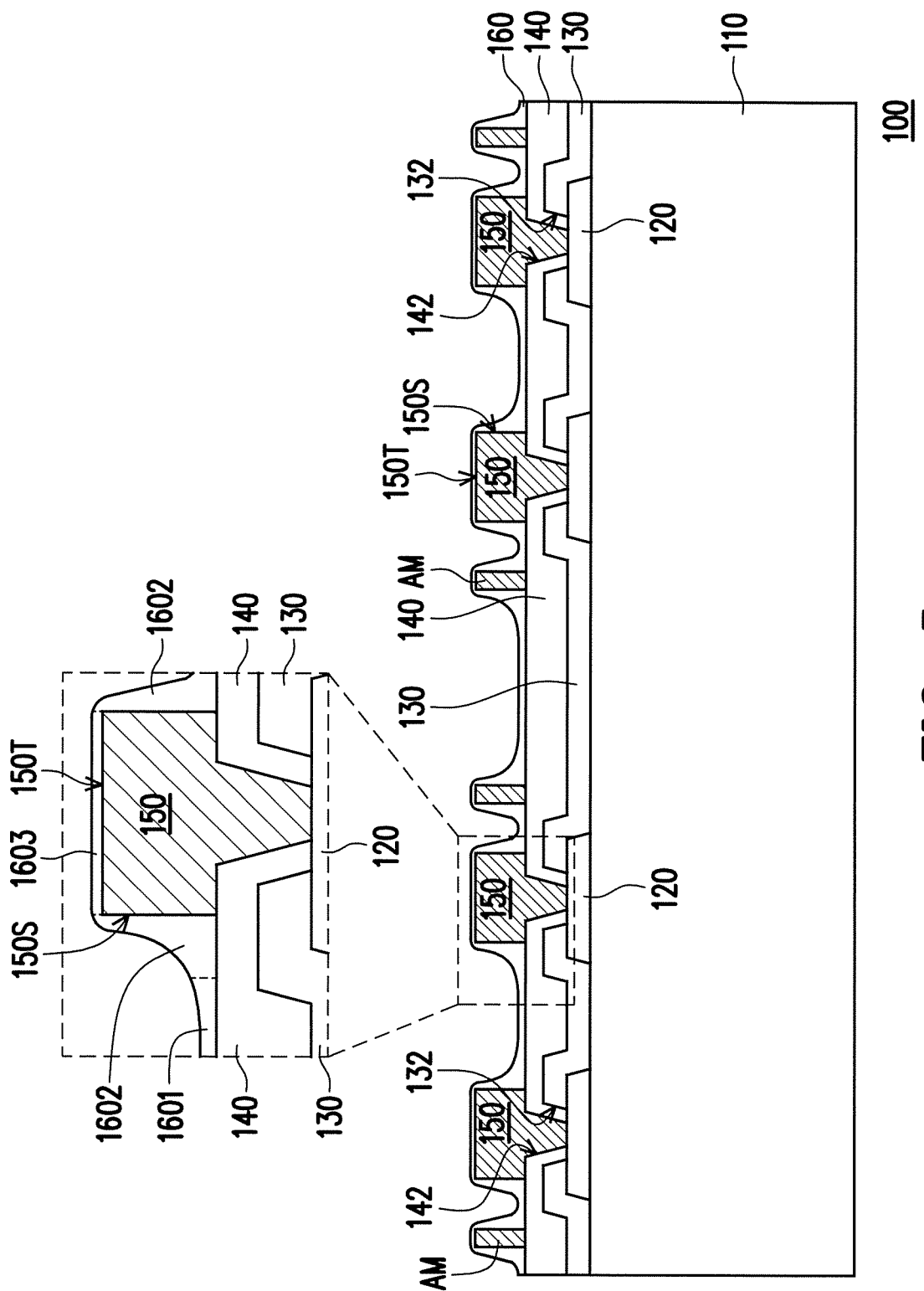

As shown in FIG. 3, the dielectric layer 160 for encapsulating the conductive vias 150 may include a plurality of first dielectric portions 1601, a plurality of second dielectric portions 1602 and a plurality of third dielectric portions 1603. The first dielectric portions 1601 cover and are in contact with the top surface of the post-passivation layer 140, the second dielectric portions 1602 extend from the first dielectric portion 1601 toward and cover the sidewalls 150S of the conductive vias 150, and the third dielectric portions 1603 cover and are in contact with the top surfaces 150T of the conductive vias 150. In some embodiments, the top surface of the first dielectric portions 1601 may have a depressed and curved surface profile. the third dielectric portion 1603 may have a thickness less than a minimum thickness of the first dielectric portions 1601 in such embodiments. The minimum thickness of the first dielectric portions 1601 of the dielectric layer 160 may range from about 5 micrometers to about 10 micrometers and the thickness of the third dielectric portions 1603 of the dielectric layer 160 may range from about 0.1 micrometers to about 10 micrometers, for example.

As shown in FIG. 3, in some embodiments, the dielectric layer 160 may be formed by a coating or dispensing process followed by a curing process.

Figure 4:
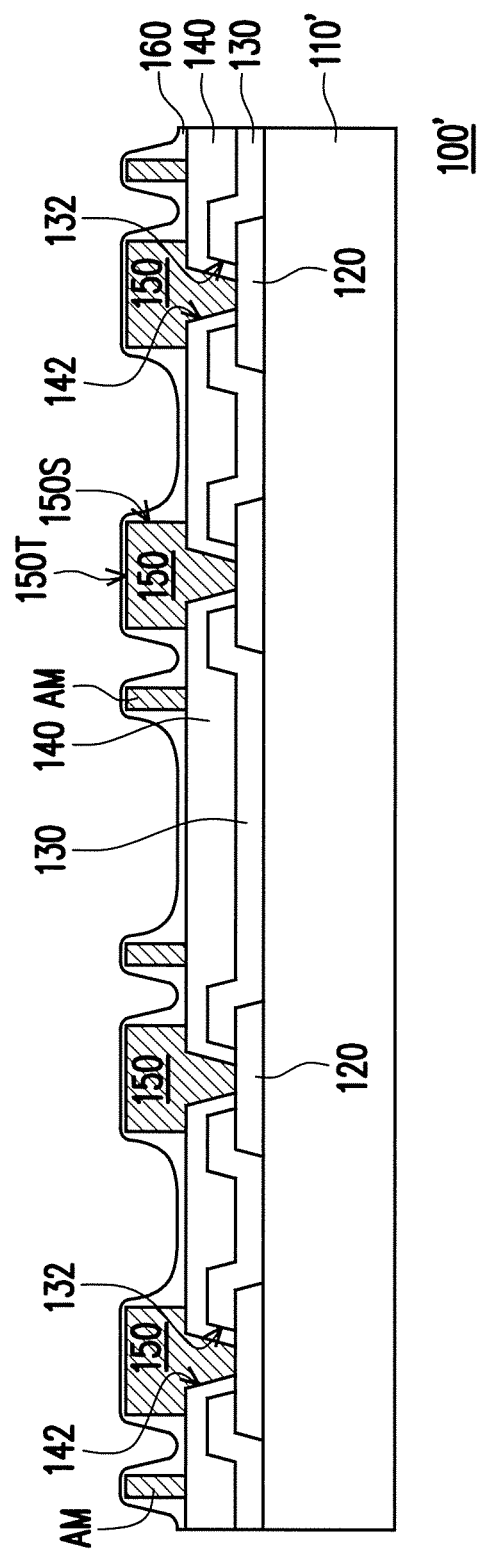

Referring to FIG. 4, a back side grinding process may be performed on a rear surface of the wafer 100 after the dielectric layer 160 is formed. The semiconductor substrate 110 is grinded such that a thinned wafer 100' including a semiconductor substrate 110', the conductive pads 120, the passivation layer 130, the post-passivation layer 140, the conductive vias 150, the alignment marks AM and the dielectric layer 160 is formed.

Figure 5:
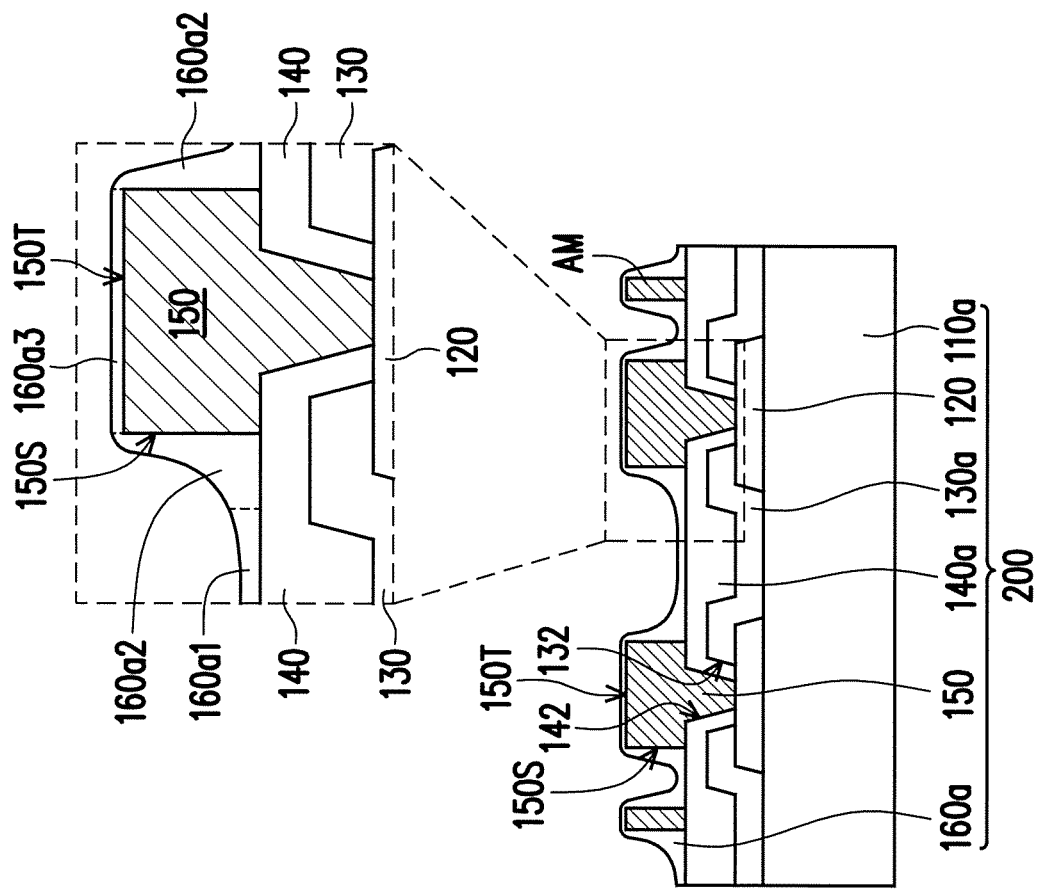
Figure 5:
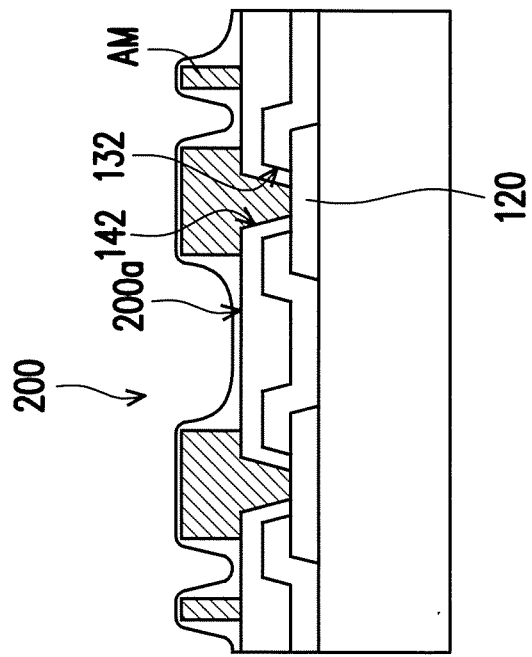

Referring to FIG. 5, after performing the back side grinding process, a wafer dicing process is performed on the thinned wafer 100' such that the integrated circuit components 200 of the thinned wafer 100' are singulated. The integrated circuit components 200 each includes an active surface 200a, and the above-mentioned conductive vias 150 and alignment marks AM protrude from the active surface 200a. As shown in FIG. 5, the integrated circuit components 200 each includes a semiconductor substrate 110a, the conductive pads 120 formed on the semiconductor substrate 110a, a passivation layer 130a, a post-passivation layer 140a, the conductive vias 150, the alignment marks AM and a dielectric layer 160a. In such embodiments, the top surface of the post-passivation layer 140a is referred to as the active surface 200a of the integrated circuit components 200. The dielectric layer 160a conformally covers the active surface 200a, the alignment marks AM and the conductive vias 150 such that the conductive vias 150, the alignment marks AM of the integrated circuit component 200 are well protected by the dielectric layer 160a. The materials and properties of the semiconductor substrate 110a, the passivation layer 130a, the post-passivation layer 140a, and the dielectric layer 160a are similar with those of the semiconductor substrate 100, the passivation layer 130, the post-passivation layer 140a, and the dielectric layer 160. Thus, the detailed descriptions of the semiconductor substrate 110a, the passivation layer 130a, and the post-passivation layer 140a are omitted herein for the sake of brevity.

As shown in FIG. 5, the dielectric layer 160a of each integrated circuit components 200 may include a plurality of first dielectric portions 160a1, a plurality of second dielectric portions 160a2 and a plurality of third dielectric portions 160a3. The first dielectric portions 160a1 cover and are in contact with the post-passivation layer 140a, the second dielectric portions 160a2 extend toward and cover the sidewalls 150S of the conductive vias 150, and the third dielectric portions 160a3 cover and are in contact with the top surfaces 150T of the conductive vias 150. In some embodiments, each of the first dielectric portions 160a1 may have a depressed and curved top surface profile, a minimum thickness of the first dielectric portions 160a1 of the dielectric layer 160a ranges from about 5 micrometers to about 10 micrometers, and the thickness of the third dielectric portions 160a3 of the dielectric layer 160a ranges from about 0.1 micrometers to about 10 micrometers, for example.

Furthermore, the second dielectric portions 160a2 of the dielectric layer 160a extend toward and cover the sidewalls of the alignment marks AM and the third dielectric portions 160a3 of the dielectric layer 160a cover and are in contact with the top surfaces of the alignment marks AM.

As shown in FIG. 4 and FIG. 5, during the back side grinding and the wafer dicing processes, the conductive vias 150 and the alignment marks AM of the integrated circuit components 200 may be well protected by the dielectric layer 160 and the dielectric layer 160a. In addition, the alignment marks AM, the conductive pads 120 and the conductive vias 150 of the integrated circuit components 200 may be protected from being damaged by sequentially performed processes, such as the pick-up and placing process of the integrated circuit components 200, the molding process, and so on.

Figure 6:
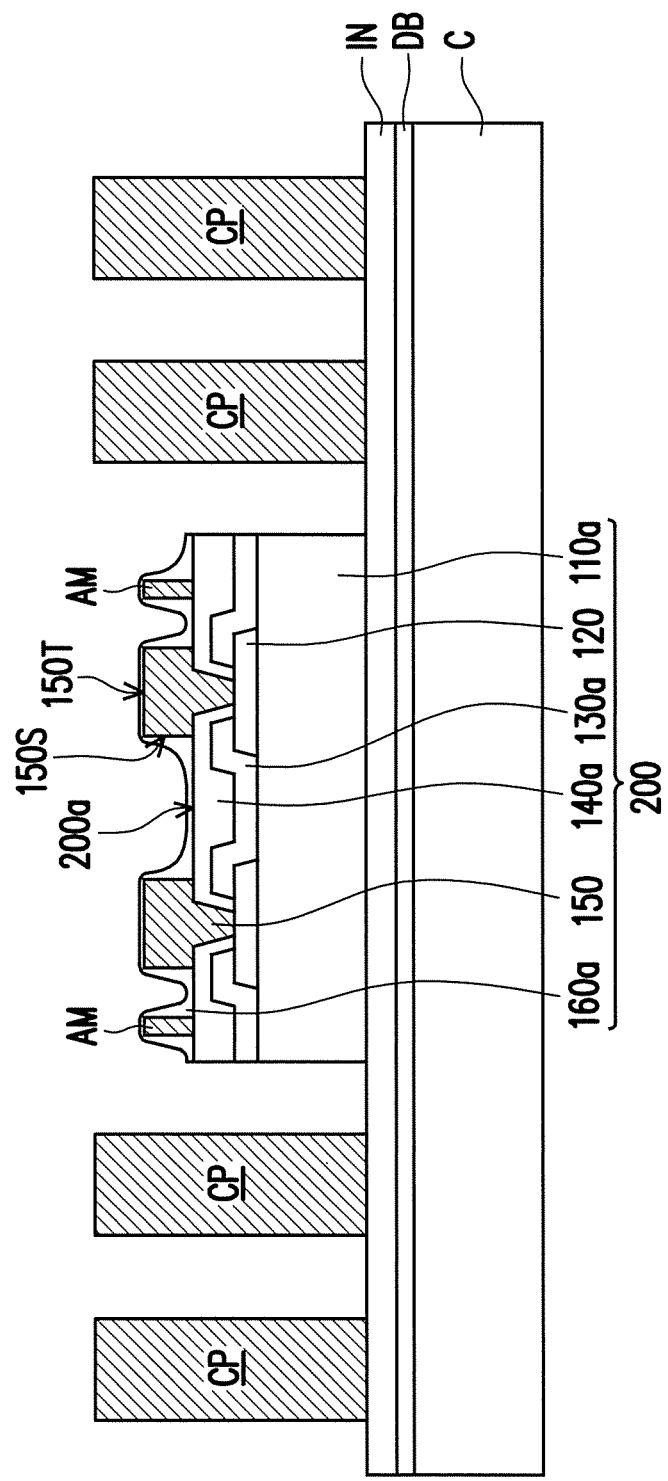

Referring to FIG. 6, a carrier C having a de-bonding layer DB and a insulating layer IN formed thereon is provided, wherein the de-bonding layer DB is between the carrier C and the insulating layer IN. In some embodiments, the carrier C is a glass substrate, the de-bonding layer DB is a light-to-heat conversion (LTHC) release layer formed on the glass substrate, and the insulating layer IN is a polybenzoxazole (PBO) layer formed on the de-bonding layer DB, for example. It is noted that the formation of the insulating layer IN is optional in some alternative embodiments. It may also be noted that materials for the carrier C, the de-bonding layer DB, and the insulating layer IN are not limited to what are disclosed herein according to the present disclosure.

After the carrier C having the de-bonding layer DB and the insulating layer IN formed thereon is provided, a plurality of conductive pillars CP are formed on the insulating layer IN. In some embodiments, the conductive pillars CP are formed over the carrier C (e.g., on the insulating layer IN) by photolithography, plating, and photoresist stripping process. In some alternative embodiments, the conductive pillars CP are pre-fabricated through other processes and are mounted over the carrier C. For example, the conductive pillars CP include copper posts or other metallic posts.

As shown in FIG. 6, in some embodiments, one of the integrated circuit components 200 including the conductive vias 150, the alignments marks AM and a dielectric layer 160a formed thereon may be picked-up and placed on the insulating layer IN carried by the carrier C. The integrated circuit component 200 is attached or adhered on the insulating layer IN through a die attach film, an adhesion paste or the like. In some alternative embodiments, more than one of the integrated circuit components 200 may be picked-up and placed on the insulating layer IN and the integrated circuit components 200 which is removably bonded to the insulating layer IN may be arranged in an array. When the integrated circuit components 200 placed on the insulating layer IN are arranged in an array, the conductive pillars CP may be divided into groups corresponding to the number of the integrated components 200.

In some embodiments, the integrated circuit component 200 may have a thickness less than a height of the conductive pillars CP. However, the disclosure is not limited thereto. In some alternative embodiments, the thickness of the integrated circuit component 200 is greater than or substantially equal to the height of the conductive pillars CP.

As shown in FIG. 6, one or more of the integrated circuit components 200 may be picked-up and placed on the insulating layer IN after the formation of the conductive pillars CP. However, the disclosure is not limited thereto. In some alternative embodiments, one or more of the integrated circuit components 200 may be picked-up and placed on the insulating layer IN before the formation of the conductive pillars CP.

Figure 7:
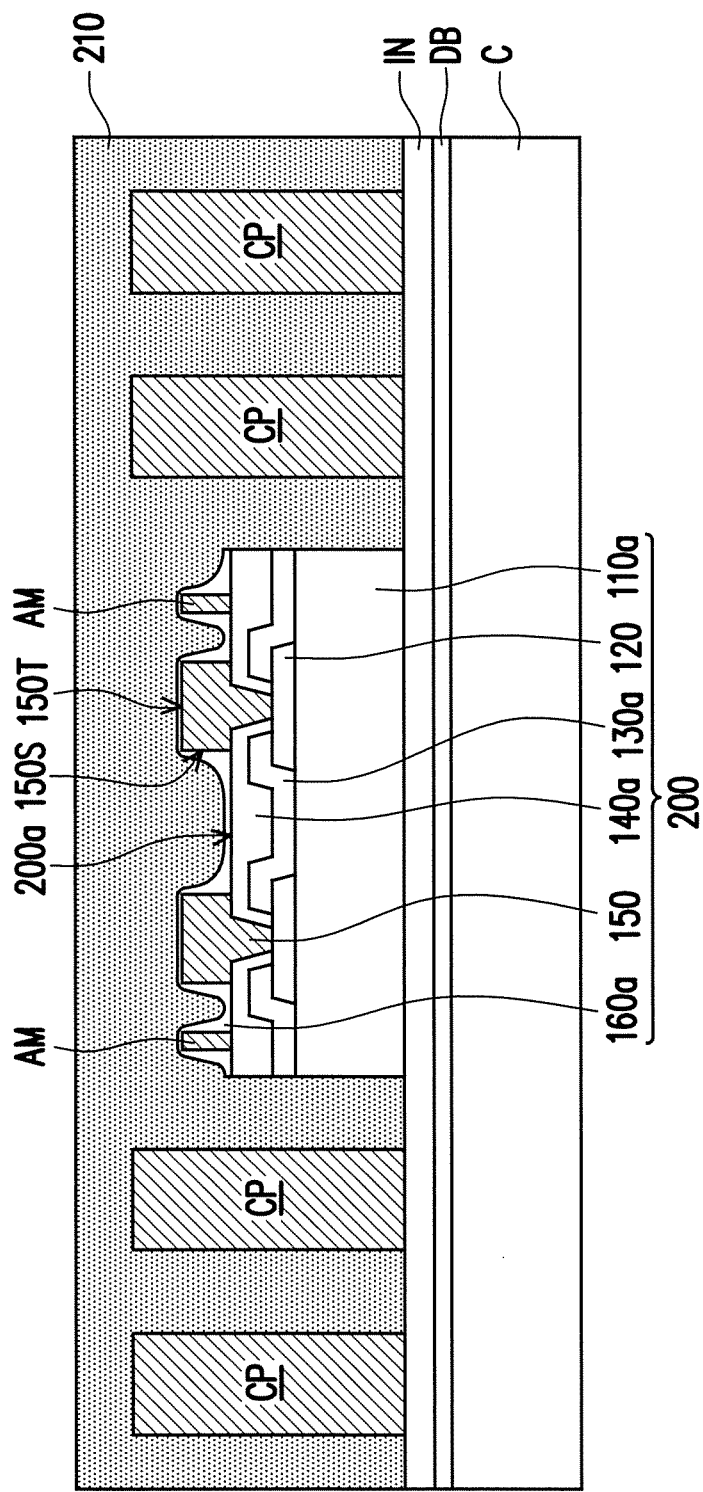

Referring to FIG. 7, an insulating material 210 is formed over the carrier C (e.g., on the insulating layer IN) to encapsulate the integrated circuit component 200 and the conductive pillars CP. In some embodiments, the insulating material 210 is a molding compound formed by a molding process and the insulating material 210 may include epoxy or other suitable resins. For example, the insulating material 210 may be epoxy resin containing chemical filler.

Figure 8:
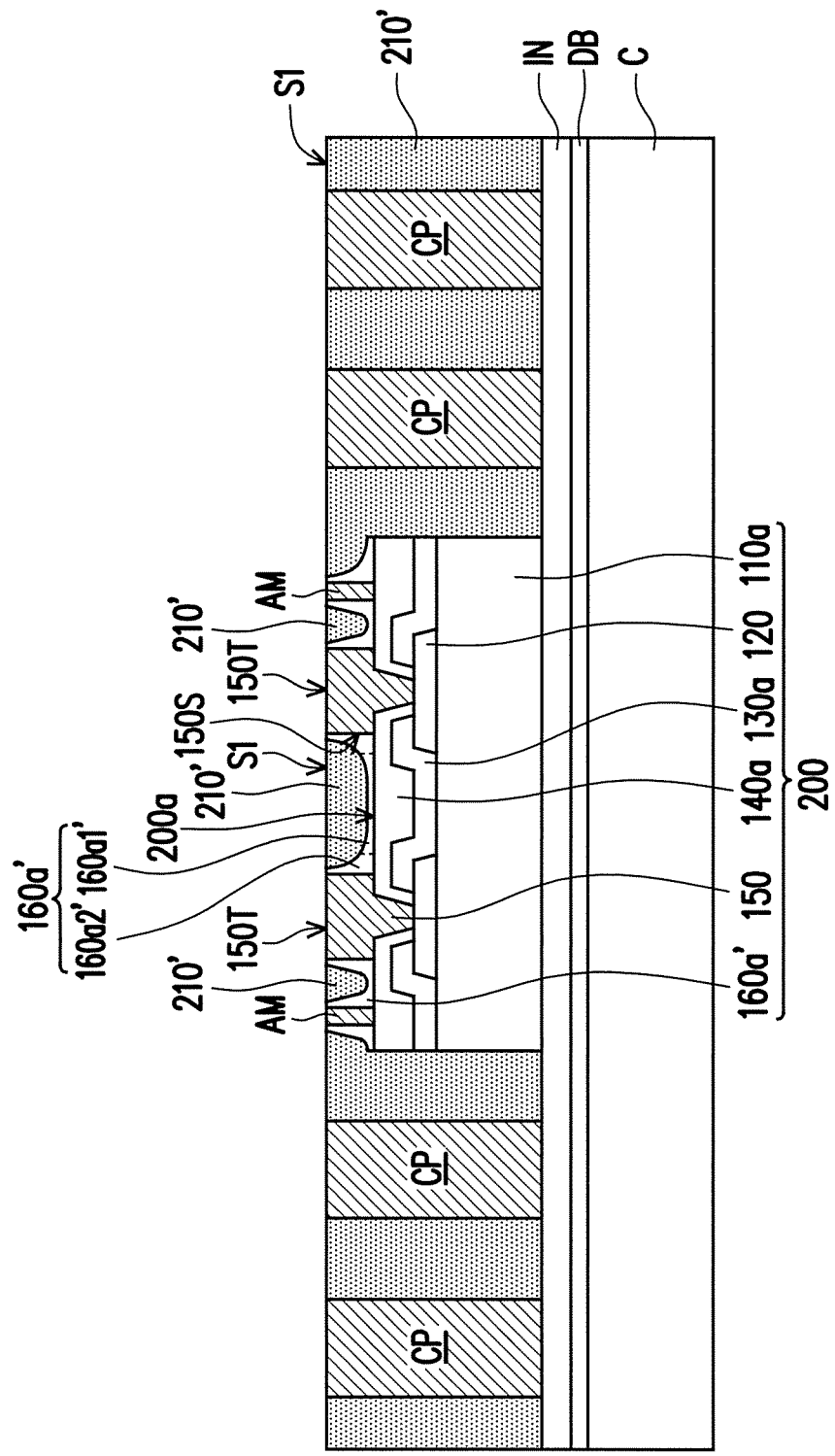

Referring to FIG. 7 and FIG. 8, the insulating material 210, as well as the conductive pillars CP, is partially grinded until the top surfaces 150T of the conductive vias 150 are exposed. After the insulating material 210 is grinded, an insulating encapsulation 210' is formed over the carrier C (e.g., on the insulating layer IN). During the grinding process of the insulating material 210 (shown in FIG. 7), portions of the dielectric layer 160a (e.g., the third dielectric portions 160a3 and portions of the second dielectric portions 160a2) are also grinded to form a patterned dielectric liner 160a'. In some embodiments, as shown in FIG. 7, during the grinding process of the insulating material 210 and the dielectric layer 160a, portions of the conductive pillars CP are grinded also. The insulating encapsulation 210' may be formed by mechanical grinding or chemical mechanical polishing (CMP), for example.

As shown in FIG. 8, the patterned dielectric liner 160a' conformally covers the active surface 200a of the integrated circuit component 200, as well as the sidewalls 150S of the conductive vias 150 and the side walls of the AM. The patterned dielectric liner 160a' includes a plurality of first dielectric portions 160a1' and second dielectric portions 160a2' connected to the first dielectric portions 160a1', wherein the first dielectric portions 160a1' cover the active surface 200a of the integrated circuit component 200 and the second dielectric portions 160a2' extend toward and cover the sidewalls 150S of the conductive vias 150. Furthermore, the second dielectric portions 160a2' of the patterned dielectric liner 160a' conformally covers the sidewalls of the at least one alignment marks AM.

The insulating encapsulation 210' encapsulates sidewalls of the integrated circuit component 200 and covers the patterned dielectric liner 160a'. In other words, the integrated circuit component 200 and the conductive pillars CP are mostly embedded in the insulating encapsulation 210' with only the top surfaces thereof being exposed. In some embodiments, the insulating encapsulation 210' covers the first dielectric portions 160a1' and the second dielectric portions 160a2' of the patterned dielectric liner 160a'. The insulating encapsulation 210' includes a planar top surface S1 which is substantially coplanar with the top surfaces 150T of the conductive vias 150. The planar top surface S1 of the insulating encapsulation 210' may also be substantially coplanar with the top surfaces of the alignment marks AM and the top surfaces of the conductive pillars CP.

After the insulating encapsulation 210' is formed, parts of the patterned dielectric liner 160a' are revealed. As shown in FIG. 8 and FIG. 13, the insulating encapsulation 210' and the conductive vias 150 are spaced apart by the patterned dielectric liner 160a'. In some embodiments, a minimum thickness of the first dielectric portions 160a1' of the dielectric layer 160a' ranges from about 5 micrometers to about 10 micrometers. In some embodiments, the conductive vias 150 are spaced apart with each other by the second dielectric portions 160a2' of the patterned dielectric liner 160a'. In other words, the insulating encapsulation 210' is not in contact with the conductive vias 150 directly. During the above-mentioned grinding process of the insulating material 210, the conductive vias 150 and the dielectric layer 160a (shown in FIG. 7 and FIG. 8), there is no apparent concave generated on the grinded surface of the second dielectric portions 160a2' and grinded copper scrap of the copper conductive vias 150 does not fill the concave generated on the grinded surface of the second dielectric portions 160a2' (i.e. copper-bur defect). Accordingly, as shown in FIG. 13, no copper-bur defect occurs at a boundary between the conductive vias 150 and the patterned dielectric liner 160a' after performing the above-mentioned grinding process. Similarly, since the insulating encapsulation 210' and the conductive vias 150 are spaced apart by the patterned dielectric liner 160a', no copper-bur defect occurs at a boundary between the alignment marks AM and the patterned dielectric liner 160a' after performing the above-mentioned grinding process. Accordingly, the reliability and the yield rate may be improved.

Furthermore, grinding marks (not shown) resulted from the grinding process may be generated and distributed on the top surfaces 150T of the conductive vias 150. The above-mentioned grinding marks are not only found on the top surfaces 150T of the conductive vias 150, but also found on the top surfaces of the alignment marks AM, the top surfaces of the conductive pillars CP, the planar top surface S1 of the insulating encapsulation 210' and the revealed portions of the patterned dielectric liner 160a'. In some embodiments, the rough grinded surfaces of the alignment marks AM are recognizable and feasible in an infrared (IR) alignment process because the IR alignment process is less sensitive to roughness of the grinded surfaces of the alignment marks AM.

Figure 9:
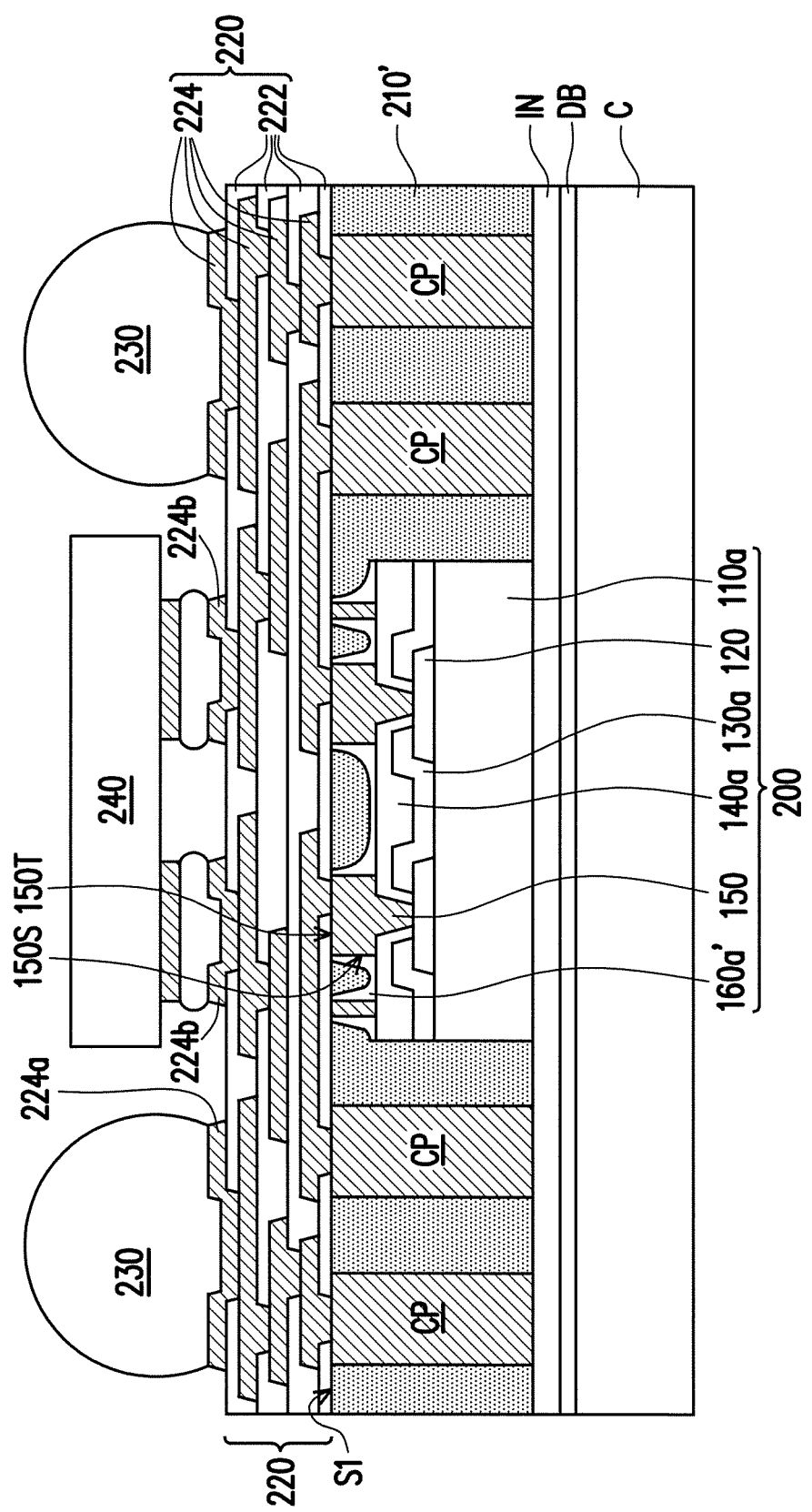

Referring to FIG. 9, after the insulating encapsulation 210' and the patterned dielectric liner 160a' are formed, a redistribution circuit structure 220 electrically connected to the conductive vias 150 of the integrated circuit component 200 is formed on the planar top surface S1 of the insulating encapsulation 210', the top surfaces 150T of the conductive vias 150 and the revealed portions (i.e., the second dielectric portions 160a2') of the patterned dielectric liner 160a'. The redistribution circuit structure 220 is fabricated to electrically connect with one or more connectors underneath. Here, the afore-said connectors may be the conductive vias 150 of the integrated circuit component 200 and/or the conductive pillars CP embedded in the insulating encapsulation 210'. The redistribution circuit structure 220 is described in accompany with FIG. 9 in detail.

Referring to FIG. 9, the redistribution circuit structure 220 includes a plurality of inter-dielectric layers 222 and a plurality of redistribution conductive layers 224 stacked alternately, and the redistribution conductive layers 224 are electrically connected to the conductive vias 150 of the integrated circuit component 200 and the conductive pillars CP embedded in the insulating encapsulation 210'. As shown in FIG. 9, in some embodiments, the top 150T surfaces of the conductive vias 150 and the top surfaces of the conductive pillars CP are in contact with the redistribution circuit structure 220. In such embodiments, the top surfaces 150T of the conductive vias 150 are in contact with the bottommost one of the redistribution conductive layers 224. The top surfaces 150T of the conductive vias 150 and the top surfaces of the conductive pillars CP are partially covered by the bottommost inter-dielectric layer 222. Furthermore, the topmost redistribution conductive layer 224 may include a plurality of pads. In such embodiments the above-mentioned pads may include a plurality of under-ball metallurgy (UBM) patterns 224a for ball mount and/or at least one connection pad 224b for mounting of passive components. The numbers of the under-ball metallurgy patterns 224a and of the connection pad 224b are not limited according to this disclosure.

As shown in FIG. 9, after the redistribution circuit structure 220 is formed, a plurality of conductive balls 230 are placed on the under-ball metallurgy patterns 224a, and a plurality of passive components 240 are mounted on the connection pad 224b. In some embodiments, the conductive balls 230 may be placed on the under-ball metallurgy patterns 224a through ball placement process and the passive components 240 may be mounted on the connection pads 240 through soldering process.

Referring to FIG. 9 and FIG. 10, after the redistribution circuit structure 220, the conductive balls 230 and the passive components 240 are formed, the insulating layer IN, the insulating encapsulation 210' and the integrated circuit component 200 are de-bonded from the de-bonding layer DB carried by the carrier C, such that the insulating layer IN is separated from the carrier C. In embodiments where the de-bonding layer DB is the LTHC release layer, irradiation by an UV laser may be utilized to facilitate peeling of the insulating layer IN from the carrier C.

As shown in FIG. 10, the insulating layer IN may be further patterned such that a plurality of contact openings O are formed in the insulating layer IN, so as to expose bottom surfaces of the conductive pillars CP. The number of the contact openings O may correspond to the number of the conductive pillars CP. In some embodiments, the contact openings O in the insulating layer IN are formed by laser drilling process or other suitable processes.

Referring to FIG. 11, after the contact openings O are formed in the insulating layer IN, a plurality of conductive balls 250 are formed on the bottom surfaces of the conductive pillars CP that are exposed by the contact openings O. And, the conductive balls 250 may be, for example, reflowed to bond with the bottom surfaces of the conductive pillars CP. As shown in FIG. 11, after the conductive balls 230 and the conductive balls 250 are formed, formation of an integrated fan-out (InFO) package of the integrated circuit component 200 having dual-side terminals is accomplished.

Referring to FIG. 12, another package 300 may be provided. In some embodiments, the package 300 provided is, for example, a memory device. The package 300 is stacked over and is electrically connected to the integrated fan-out package illustrated in FIG. 11 through the conductive balls 250, such that a package-on-package (POP) structure is fabricated.

In the above-mentioned embodiments, the reliability and yield rate of the integrated fan-out package are improved due to the fabrication of the conformal patterned dielectric liner. Furthermore, the amount of the material used in the fabrication of the conformal patterned dielectric liner may be reduced and the fabrication cost is reduced accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the present disclosure, an integrated circuit package including an integrated circuit component, a patterned dielectric liner, and an insulating encapsulation is provided. The integrated circuit component includes an active surface and conductive vias distributed on the active surface. The patterned dielectric liner conformally covers the active surface of the integrated circuit component and sidewalls of the conductive vias. The insulating encapsulation encapsulates sidewalls of the integrated circuit component and covers the patterned dielectric liner. The insulating encapsulation includes a planar top surface. The planar top surface of the insulating encapsulation is substantially coplanar with top surfaces of the conductive vias. The insulating encapsulation and the conductive vias are spaced apart by the patterned dielectric liner.

In accordance with alternative embodiments of the present disclosure, an integrated circuit package including an integrated circuit component, a patterned dielectric liner, and an insulating encapsulation is provided. The integrated circuit component includes an active surface and conductive vias distributed on the active surface. The patterned dielectric liner conformally covers the active surface of the integrated circuit component and sidewalls of the conductive vias. The patterned dielectric liner includes a first dielectric portion and second dielectric portions connected to the first dielectric portion, the first dielectric portion covers the active surface of the integrated circuit component and the second dielectric portions extend toward and cover the sidewalls of the conductive vias. The insulating encapsulation encapsulates sidewalls of the integrated circuit component and covers the first dielectric portion and the second dielectric portions of the patterned dielectric liner. The insulating encapsulation includes a planar top surface. The planar top surface of the insulating encapsulation is substantially coplanar with top surfaces of the conductive vias. The insulating encapsulation and the conductive vias are spaced apart by the second dielectric portions of the patterned dielectric liner.

In accordance with yet alternative embodiments of the present disclosure, a method of fabricating an integrated circuit package is provided. The method includes the following steps. An integrated circuit component which is removably bonded to a carrier and the integrated circuit component includes an active surface, conductive vias distributed on the active surface and a dielectric layer. The dielectric layer conformally covers the active surface of the integrated circuit component and sidewalls of the conductive vias. An insulating material is formed over the carrier to encapsulate the dielectric layer formed on the integrated circuit component and sidewalls of the integrated circuit component. The insulating material and the dielectric layer on top surfaces of the conductive vias are partially grinded until the top surfaces of the conductive vias are exposed so as to respectively form an insulating encapsulation and a patterned dielectric liner, wherein the insulating encapsulation includes a planar top surface and the patterned dielectric liner conformally covers the active surface of the integrated circuit component and the conductive vias, a planar top surface of the insulating encapsulation is substantially coplanar with the top surfaces of the conductive vias, wherein the insulating encapsulation and the conductive vias are spaced apart by the patterned dielectric liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package, comprising:
   a conductive pillar;
   an integrated circuit component comprising an active surface, conductive pads disposed on the active surface, a passivation layer covering the active surface, at least one alignment mark disposed on the passivation layer, and conductive vias, wherein the conductive vias are in contact with the conductive pads through contact openings of the passivation layer, the at least one alignment mark is electrically floating, the at least one alignment mark is located within a confinement of the active surface of the integrated circuit component, and the at least one alignment mark is separated from the conductive pads by the passivation layer;
   a patterned dielectric liner conformally covering sidewalls of the at least one alignment mark, and sidewalls of the conductive vias;
   an insulating encapsulation encapsulating the conductive pillar, sidewalls of the integrated circuit component, and the insulating encapsulation covering the patterned dielectric liner, wherein a thickness of the at least one alignment mark is less than a height of the conductive pillar; and
   a fan-out redistribution circuit structure in contact with top surfaces of the insulating encapsulation, the conductive vias, the at least one alignment mark, and the conductive pillar, and the redistribution circuit structure being electrically connected to the conductive vias and the conductive pillar.

2. The integrated circuit package of claim 1, wherein a height of the conductive vias ranges from about 5 micrometers to about 50 micrometers.

3. The integrated circuit package of claim 1, wherein grinding marks are distributed on the first top surfaces of the conductive vias and the second top surface of the at least one alignment mark.

4. The integrated circuit package of claim 1, wherein a minimum thickness of the patterned dielectric liner ranges from about 5 micrometers to about 10 micrometers.

5. The integrated circuit package of claim 1, wherein the second top surface of the at least one alignment mark is in contact with a bottommost inter-dielectric layer of the redistribution circuit structure.

6. The integrated circuit package of claim 1, wherein the first top surfaces of the conductive vias are in contact with a bottommost redistribution conductive layer of the redistribution circuit structure.

7. The integrated circuit package of claim 5, further comprising conductive pillars embedded in and penetrating the insulating encapsulation, wherein the conductive pillars are electrically connected to the redistribution circuit structure.

8. The integrated circuit package of claim 1, wherein the second top surface of the at least one alignment mark is substantially leveled with the first top surfaces of the conductive vias.

9. An integrated circuit package, comprising:
   a conductive pillar;
   an integrated circuit component comprising an active surface, conductive pads disposed on the active surface, a passivation layer covering the active surface, at least one alignment mark disposed on the passivation layer, and conductive vias, wherein the conductive vias are in contact with the conductive pads through contact openings of the passivation layer, the at least one alignment mark is electrically floating, the at least one alignment mark is located within a confinement of the active surface of the integrated circuit component, and the at least one alignment mark is separated from the conductive pads by the passivation layer;
   a patterned dielectric liner conformally covering sidewalls of the at least one alignment mark, and sidewalls of the conductive vias, the patterned dielectric liner comprising a first dielectric portion and second dielectric portions connected to the first dielectric portion, the first dielectric portion covering the active surface of the integrated circuit component, and the second dielectric portions extending toward and covering the sidewalls of the conductive vias and the sidewalls of the at least one alignment mark;

an insulating encapsulation encapsulating sidewalls of the integrated circuit component, and the insulating encapsulation covering the first dielectric portion and the second dielectric portions of the patterned dielectric liner, wherein a thickness of the at least one alignment mark is less than a height of the conductive pillar; and a redistribution circuit structure in contact with top surfaces of the insulating encapsulation, the conductive vias, the at least one alignment mark, and the conductive pillar, the redistribution circuit structure being electrically connected to the conductive vias and the conductive pillar.

10. The integrated circuit package of claim 9, wherein the second top surface of the at least one alignment mark is in contact with a bottommost inter-dielectric layer of the redistribution circuit structure.

11. The integrated circuit package of claim 9, wherein grinding marks are distributed on the first top surfaces of the conductive vias and the second top surface of the at least one alignment mark.

12. The integrated circuit package of claim 9, wherein a minimum thickness of the first dielectric portion of the patterned dielectric liner ranges from about 5 micrometers to about 10 micrometers.

13. The integrated circuit package of claim 9, wherein a top surface of each of the first dielectric portions comprises a depressed and curved surface profile.

14. The integrated circuit package of claim 9, wherein the first top surfaces of the conductive vias are in contact with a bottommost redistribution conductive layer of the redistribution circuit structure, and the second top surface of the at least one alignment mark is in contact with a bottommost inter-dielectric layer of the redistribution circuit structure.

15. The integrated circuit package of claim 9, wherein a height of the conductive vias ranges from about 5 micrometers to about 50 micrometers.

16. The integrated circuit package of claim 9, wherein the second top surface of the at least one alignment mark is substantially leveled with the first top surfaces of the conductive vias.

17. A method of fabricating an integrated circuit package, the method comprising:
providing an integrated circuit component which is removably bonded to a carrier, the integrated circuit component comprising an active surface, conductive pads disposed on the active surface, a passivation layer covering the active surface, at least one alignment mark disposed on the passivation layer, conductive vias, and a dielectric layer conformally covering the active surface of the integrated circuit component, the at least one alignment mark and the conductive vias, wherein the conductive vias are in contact with the conductive pads through contact openings of the passivation layer, the at least one alignment mark is electrically floating, the at least one alignment mark is located within a confinement of the active surface of the integrated circuit component, and the at least one alignment mark is separated from the conductive pads by the passivation layer;

providing a conductive pillar on the carrier;

forming an insulating material over the carrier to encapsulate the conductive pillar, the dielectric layer formed on the integrated circuit component and sidewalls of the integrated circuit component; and partially grinding the insulating material and the dielectric layer until the first top surfaces of the conductive vias, a second top surface of the at least one alignment mark, and a third top surface of the conductive pillar are exposed so as to respectively form an insulating encapsulation and a patterned dielectric liner, the insulating encapsulation comprising a planar top surface, the patterned dielectric liner conformally covering the active surface of the integrated circuit component and sidewalls of the conductive vias, wherein a thickness of the at least one alignment mark is less than a height of the conductive pillar.

18. The method of claim 17, wherein the dielectric layer is formed by a coating or dispensing process followed by a curing process.

19. The method of claim 17, wherein a minimum thickness of the patterned dielectric liner ranges from about 5 micrometers to about 10 micrometers.

20. The method of claim 17 further comprising:
forming a redistribution circuit structure on the planar top surface of the insulating encapsulation, the first top surfaces of the conductive vias, the second top surface of the at least one alignment mark and the patterned dielectric liner, the redistribution circuit structure being electrically connected to the conductive vias; and
after forming the redistribution circuit structure, de-bonding the integrated circuit component and the insulating encapsulation from the carrier.

* * * * *